United States Patent
Koido (10) Patent No.: US 10,854,435 B2
(45) Date of Patent: Dec. 1, 2020

(54) SPUTTERING TARGET OF SINTERED SB—TE-BASED ALLOY

(71) Applicant: JX Nippon Mining & Metals Corporation, Tokyo (JP)

(72) Inventor: Yoshimasa Koido, Ibaraki (JP)

(73) Assignee: JX NIPPON MINING & METALS CORPORATION, Tokyo (JP)

( * ) Notice: Subject to any disclaimer, the term of this patent is extended or adjusted under 35 U.S.C. 154(b) by 20 days.

(21) Appl. No.: 15/102,305

(22) PCT Filed: Feb. 20, 2015

(86) PCT No.: PCT/JP2015/054712
§ 371 (c)(1),
(2) Date: Jun. 7, 2016

(87) PCT Pub. No.: WO2015/146394
PCT Pub. Date: Oct. 1, 2015

(65) Prior Publication Data
US 2016/0314945 A1 Oct. 27, 2016

(30) Foreign Application Priority Data

Mar. 25, 2014 (JP) .................. 2014-061965
Mar. 25, 2014 (JP) .................. 2014-061966

(51) Int. Cl.
*H01J 37/34* (2006.01)
*C23C 14/34* (2006.01)
(Continued)

(52) U.S. Cl.
CPC ............ *H01J 37/3429* (2013.01); *B22F 3/15* (2013.01); *B22F 9/04* (2013.01); *B22F 9/082* (2013.01); *C22C 1/04* (2013.01); *C22C 12/00* (2013.01); *C22C 28/00* (2013.01); *C23C 14/0623* (2013.01); *C23C 14/08* (2013.01);
(Continued)

(58) Field of Classification Search
CPC .............. H01J 37/3426; H01J 37/3429; C23C 14/0623; C23C 14/3414; C23C 14/14; C23C 14/08; C23C 14/086; C23C 14/083; C23C 14/10; B22F 9/082; B22F 9/04;
(Continued)

(56) References Cited

U.S. PATENT DOCUMENTS 7,803,209 B2   9/2010   Takahashi
7,943,021 B2   5/2011   Takahashi
(Continued)

FOREIGN PATENT DOCUMENTS

JP   H05-070937 A     3/1993
JP   2001098366 A  *  4/2001
(Continued)

*Primary Examiner* — Michael A Band
(74) *Attorney, Agent, or Firm* — Howson & Howson LLP (57) ABSTRACT

Sb—Te-based alloy sintered sputtering target having a Sb content of 10 to 60 at %, a Te content of 20 to 60 at %, and remainder being one or more types of elements selected from Ag, In, and Ge and unavoidable impurities, wherein an average grain size of oxides is 0.5 μm or less. An object of this invention is to improve the texture of the Sb—Te-based alloy sintered sputtering target in order to prevent the generation of arcing during sputtering and improve the thermal stability of the sputtered film.

4 Claims, 1 Drawing Sheet

(51) Int. Cl.
*C23C 14/14* (2006.01)
*C23C 14/10* (2006.01)
*C23C 14/08* (2006.01)
*C23C 14/06* (2006.01)
*B22F 9/08* (2006.01)
*B22F 9/04* (2006.01)
*B22F 3/15* (2006.01)
*C22C 28/00* (2006.01)
*C22C 12/00* (2006.01)
*C22C 1/04* (2006.01)

(52) U.S. Cl.
CPC .......... *C23C 14/083* (2013.01); *C23C 14/086* (2013.01); *C23C 14/10* (2013.01); *C23C 14/14* (2013.01); *C23C 14/3414* (2013.01); *B22F 2009/044* (2013.01); *B22F 2209/0848* (2013.01)

(58) Field of Classification Search
CPC ................. B22F 3/15; B22F 2209/044; B22F 2209/0848; C22C 1/04; C22C 12/00; C22C 28/00
See application file for complete search history.

(56) References Cited

U.S. PATENT DOCUMENTS

| | | | |
|---|---|---|---|
| 7,947,106 | B2 | 5/2011 | Takahashi |
| 8,882,975 | B2 | 11/2014 | Yahagi et al. |
| 9,299,543 | B2 | 3/2016 | Takahashi |
| 2007/0297938 | A1 | 12/2007 | Takahashi |
| 2009/0071821 | A1 | 3/2009 | Takahashi |
| 2009/0301872 | A1* | 12/2009 | Yahagi ............ C22C 1/05 204/298.13 |
| 2010/0025236 | A1 | 2/2010 | Takahashi |
| 2010/0206724 | A1 | 8/2010 | Takahashi |
| 2011/0017590 | A1 | 1/2011 | Fukuyo et al. |
| 2011/0027597 | A1 | 2/2011 | Ohba et al. |
| 2012/0097530 | A1 | 4/2012 | Takahashi |
| 2012/0279857 | A1 | 11/2012 | Takahashi et al. |
| 2012/0286219 | A1 | 11/2012 | Ikisawa et al. |
| 2014/0151624 | A1 | 6/2014 | Ohba et al. |

FOREIGN PATENT DOCUMENTS

| | | |
|---|---|---|
| JP | 2004-323919 A | 11/2004 |
| JP | 2005-117031 A | 4/2005 |
| WO | 2005/005683 A1 | 1/2005 |
| WO | 2009/107498 A1 | 9/2009 |

\* cited by examiner

SPUTTERING TARGET OF SINTERED SB—TE-BASED ALLOY

BACKGROUND

The present invention relates to a Sb—Te-based alloy sintered target suitable for forming a phase change recording layer, and in particular relates to a Sb—Te-based alloy sintered sputtering target capable of reducing the generation of abnormal discharge or particles during sputtering caused by oxygen and oxides.

In recent years, a thin film made from a Sb—Te-based alloy material is being used as a phase change recording material; that is, a medium for recording information by utilizing phase transformation. As the method of forming this thin film made from a Sb—Te-based alloy material, the vacuum deposition method, the sputtering method and other methods generally referred to as physical deposition methods are normally used. In particular, this thin film is often formed using a magnetron sputtering device in light of its operability and stability of the film.

When forming a film via the sputtering method, positive ions such as Ar ions are physically collided with a target mounted on a cathode, the material configuring the target is sputtered using the collision energy, and a film having substantially the same composition as the target material is deposited on a substrate mounted on an anode facing the cathode.

Film deposition via the sputtering method is characterized in that thin films of Angstrom units to thick films of several ten μm can be formed at a stable deposition rate by controlling the processing time or supplied power.

When forming a film made from a Sb—Te-based alloy material for use as a phase change recording film, what is particularly problematic is the generation of abnormal textures such as nodules (abnormal protrusions) and craters (abnormal recesses) on the target surface, which in turn become the source of micro arcing (abnormal discharge), and such abnormal textures themselves get mixed into the thin film as clustered (aggregate of atoms) foreign substances referred to as particles.

Moreover, other problems include cracks and fractures in the target during sputtering, non-uniformity in the formed thin film, and gas components such as large amounts of oxygen that are absorbed during the production process of the sintered powder for forming a target affect the film quality of the sputtered film.

These problems of the target or problems that arise during sputtering become a major cause in deteriorating the quality or yield of the thin film as the recording medium.

It is known that the foregoing problems are largely affected by the grain size of the sintering powder and the structure and property of the target. Nevertheless, conventionally, upon producing a Sb—Te-based alloy sputtering target for forming a phase change recording layer, since the target obtained via sintering did not possess sufficient characteristics, it was not possible to avoid the generation or particles and abnormal discharge (arcing) during sputtering, generation of nodules and craters on the target, generation of cracks or fractures of the target, and existence of gas components such as large amounts of oxygen contained in the target.

As the method of producing a conventional Sb—Te-based alloy-based sputtering target, it was standard practice to prepare powders by rapidly cooling a Sb—Te alloy, a Ge—Sb—Te alloy, an In—Sb—Te alloy, a Ag—Sb—Te alloy or other alloys via inert gas atomization, uniformly mixing these powders and performing pressure sintering thereto, and produce a sputtering target having the foregoing composition.

Generally speaking, with these Sb—Te-based alloy-based sputtering targets, while it is recognized that the amount of oxygen needs to be reduced, in recent years, technologies of including a certain amount of oxygen have also been disclosed. Public technologies related to Sb—Te-based alloy-based sputtering targets containing oxygen are introduced below.

Document 1 below describes as follows: "A Sb—Te-based alloy powder for sintering characterized in that the maximum grain size of the powder obtained by additionally subjecting a gas atomized powder of a Sb—Te-based alloy to mechanical pulverization is 90 μm or less, a sintered sputtering target obtained by sintering the foregoing powder, and a method of producing a Sb—Te-based alloy powder for forming a sintered sputtering target characterized in melting a Sb—Te-based alloy and thereafter performing gas atomization to obtain an atomized powder, and additionally subjecting the obtained atomized powder to mechanical pulverization in an inert atmosphere without exposing it to the atmosphere, wherein the maximum grain size of the powder is 90 μm or less, and a powder having a reduced oxygen content can be produced. The uniformity and refinement of the Sb—Te-based alloy sputtering target texture are sought, generation of cracks in the sintered target is inhibited, and generation of arcing during sputtering is prevented. Moreover, irregularities on the surface caused by sputter erosion are reduced, and a Sb—Te-based alloy sputtering target with favorable qualities is obtained". Claim 2 of Document 1 describes that the oxygen concentration is 1500 wtppm or less.

Document 2 below describes as follows: "A Sb—Te-based alloy powder for sintering characterized in that the average grain size is 0.1 to 200 μm and the oxygen content is 1000 wtppm or less, and a sintered target configured from a Sb—Te-based alloy characterized in that the oxygen content is 1000 wtppm or less, the transverse rupture strength is 50 MPa or more, and the relative density is 99% or higher. The uniformity and refinement of the Sb—Te-based alloy sputtering target texture are sought, generation of cracks in the sintered target is inhibited, and generation of arcing during sputtering is prevented. Moreover, irregularities on the surface caused by sputter erosion are reduced, and a Sb—Te-based alloy sputtering target with favorable qualities is obtained". Document 2 describes that the oxygen content is 1000 wtppm.

Document 3 below describes as follows: "An object of this invention is to provide a target for an optical disk containing chalcogenide-based elements and in which the concentration of the contained oxygen is 800 ppm or less, as well as a method of producing such a target. This target is configured from a chalcogenide-based alloy having a composition of containing one or more types of Se and Te, and the concentration of the contained oxygen is 800 ppm or less. Moreover, the method of producing this target according to the present invention includes the following steps; specifically, melting a mixture of the compositions, casting the molten material to obtain a chalcogenide-based alloy, pulverizing the obtained alloy in an inert atmosphere, and thereafter molding and sintering the resulting product. This target can deposit a sputtering film having a low oxygen concentration, suppress the oxidation rate of the film, and increase the adhesive strength of the film and the protective film. Moreover, this production method can obtain a uniform alloy phase, prevent oxidation in the pulverization process, and reduce the concentration of the oxygen contained in the target". Paragraph [0046] of D3 describes that the oxygen content of a conventional target is 2000 to 3000 ppm.

Document 4 below describes as follows: "A Sb—Te-based alloy sintered target produced using an atomized powder made from Sb—Te-based alloy grains of substantially a spherical shape, wherein grains that became flat as a result of the spherical shaped atomized powder being crushed and in which the ratio (flattening ratio) of the short axis and the long axis of the flat grains is 0.6 or less account for 50% or more among all grains. The foregoing Sb—Te-based alloy sintered target in which grains, wherewith the orientation of the long axis is aligned to be within ±45° in a direction that is parallel to the target surface, account for 60% or more among all grains. The foregoing Sb—Te-based alloy sintered target in which the oxygen concentration in the target is 1500 wtppm or less. The uniformity and refinement of the Sb—Te-based alloy sputtering target texture are sought, generation of cracks in the sintered target is inhibited, and generation of arcing during sputtering is prevented. Moreover, irregularities on the surface caused by sputter erosion are reduced, and a Sb—Te-based alloy sputtering target with favorable qualities is obtained". Furthermore, the Comparative Examples of D4 describe that the oxygen concentration in the target is 1800 wtppm.

Furthermore, Document 5 below describes a Sb—Te-based alloy sintered sputtering target in which the content of gas components is 1500 ppm or less, and Document 6 below describes Comparative Examples in which the oxygen content in a Ge—In—Sb—Te sputtering target is 2000 wtppm and 2500 wtppm. Moreover, Document 7 below describes the oxygen content in a Ge—Sb—Te target is 0.3 to 1.5%. Moreover, Document 8 below describes a sintered target in which the oxygen concentration is 5000 ppm or more. Furthermore, Document 9 and Document 10 disclose techniques of including Si in a Sb—Te-based alloy sintered sputtering target.

Accordingly, it could be said that the inclusion of oxygen in a Sb—Te-based alloy target at an oxygen concentration of roughly 1000 to 15000 ppm (1.5%) is a well-known technique. Nevertheless, there is a problem in that the manner in which the foregoing oxygen exists in the Sb—Te-based alloy target is completely unknown. As a result, it cannot be said that the characteristics and functions of the target are sufficient. Moreover, there is no technology of improving the characteristics of the Sb—Te-based alloy target by including fine oxide grains, and there is a problem in that the diversity of the Sb—Te-based alloy target is insufficient.

PRIOR ART DOCUMENTS

Patent Documents

[Patent Document 1] WO2006/077692
[Patent Document 2] WO2009/107498
[Patent Document 3] Japanese Patent Application Publication No. H5-70937
[Patent Document 4] WO2006/067937
[Patent Document 5] WO2006/059429
[Patent Document 6] WO2005/005683
[Patent Document 7] Japanese Patent Application Publication No. 2004-323919
[Patent Document 8] WO2010-137485
[Patent Document 9] Japanese Patent Application Publication No. 2011-26679
[Patent Document 10] Japanese Patent Application Publication No. 2005-117031

SUMMARY

The present invention provides a Sb—Te-based alloy sintered target for use in forming a phase change recording layer or the like and capable of effectively inhibiting the generation of abnormal discharge (arcing), nodules and particles during sputtering caused by oxides, and the occurrence of cracks or fractures of the target.

As the technical means for resolving the foregoing problems, the present inventors discovered that a stable and uniform Sb—Te-based alloy sintered target can be obtained by adding a specific amount of oxygen or oxides and devising the structure and characteristics of the target. Specifically, by controlling the oxygen content or oxides configuring the target, it is possible to improve the characteristics of the target and improve the characteristics of a stable Sb—Te-based alloy. Moreover, by improving the uniformity and refinement of the oxides, it is possible to improve the characteristics of the target and achieve stable sputtering.

Based on the foregoing discovery, the present invention provides the following invention.

1) A Sb—Te-based alloy sintered sputtering target having a Sb content of 10 to 60 at %, a Te content of 20 to 60 at %, and remainder being one or more types of elements selected from Ag, In, and Ge and unavoidable impurities, wherein an average grain size of oxides is 0.5 µm or less.

2) The Sb—Te-based alloy sintered sputtering target according to 1) above, wherein a maximum grain size of oxides is 1.5 µm or less.

3) The Sb—Te-based alloy sintered sputtering target according to 1) or 2) above, wherein a number of oxide grains having a size of 1 µm or more is 0.5% or less relative to a total number of oxide grains.

4) The Sb—Te-based alloy sintered sputtering target according to any one of 1) to 3) above, further containing one or more types of elements selected from Ga, Ti, Au, Pt, Pd, Bi, B, C, Mo, and Si in an amount of 30 at % or less.

5) The Sb—Te-based alloy sintered sputtering target according to any one of 1) to 4) above, further containing one or more types of elements selected from Ga, Ti, Au, Pt, Pd, Bi, B, C, Mo, and Si as oxides.

6) The Sb—Te-based alloy sintered sputtering target according to any one of 1) to 5) above, wherein an average content of oxygen in the target is 1500 to 2500 wtppm.

7) The Sb—Te-based alloy sintered sputtering target according to any one of 1) to 6) above, wherein a maximum content of oxygen in the target is 3500 ppm or less.

8) The Sb—Te-based alloy sintered sputtering target according to any one of 1) to 7) above, wherein a concentration difference of oxygen in the target is 2000 wtppm or less.

9) The Sb—Te-based alloy sintered sputtering target according to any one of 1) to 5) above, further containing oxides of one or more types of elements selected from Mg, Al, Si, Ti, Cu, Y, Zr, Nb, Hf, Ta, Ce, and Cd in an amount of 0.1 to 5 mol %.

With the Sb—Te-based alloy sintered target of the present invention, the characteristics of the Sb—Te-based alloy can be improved by controlling the oxide grains configuring the target and controlling the oxygen content. In other words, by refining the oxide grains and attaining a uniform oxygen concentration, it is possible to improve the characteristics of the target and achieve stable sputtering. It is thereby possible to prevent the generation of abnormal discharge originating from the oxides, and inhibit the generation of particles caused by arcing. The present invention additionally yields a superior effect of being able to improve the uniformity of the sputtered film.

DETAILED DESCRIPTION

The Sb—Te-based alloy sintered sputtering target of the present invention is configured from a sputtering target having a Sb content of 10 to 60 at %, a Te content of 20 to 60 at %, and remainder being one or more types of elements selected from Ag, In, and Ge and unavoidable impurities. The contents of the foregoing components; specifically, the Sb content, the Te content and the content of one or more types of elements selected from Ag, In, and Ge, show the preferred materials and component composition (including the compositional range) for use as a phase change recording material; that is, a medium for recording information by utilizing phase transformation.

In order to finely disperse oxides in the Sb—Te-based alloy sintered sputtering target, preferably the maximum grain size of the oxides is 1.5 µm or less, the average grain size of the oxides is 0.5 µm or less, and the number of oxide grains having a size of 1 µm or more is 1.5% or less, more preferably 0.5% or less, relative to the total number of oxide grains. These values may be arbitrarily controlled in correspondence with the mode of using the Sb—Te-based alloy sintered sputtering target. Based on the above, it is possible to obtain a Sb—Te-based alloy sintered sputtering target having fine oxide grains dispersed therein and which generates minimal arcing.

Figure 1:
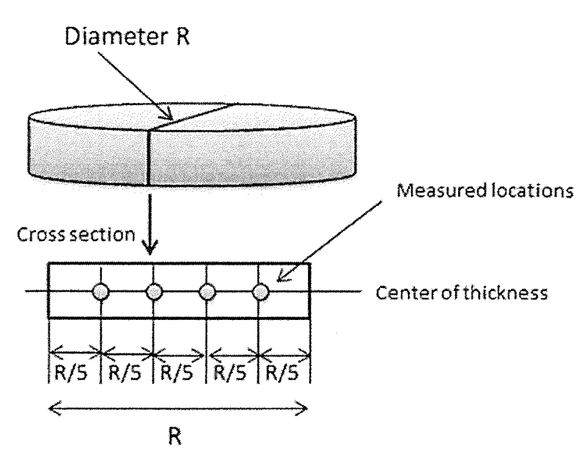
FIG. 1 is an explanatory diagram showing a case where an SEM (scanning electron microscope) is used for measuring the maximum grain size, the number of grains having a size exceeding 1 µm, and the total number of grains of four locations in the cross section of the target in the visual field.

With regard to the number of oxide grains having a size of 1 µm or more being 1.5% or less, more preferably 0.5% or less, relative to the total number of oxide grains, a case in a specific visual field is anticipated, but this can be measured according to the following method. Specifically, an SEM (scanning electron microscope) is used for observing a 2000× visual field of the cross section of the target. In this visual field, the maximum grain size, the number of grains having a size exceeding 1 µm, and the total number of grains are measured. Note that the grain size is measured as the diameter of a circle in which the maximum diameter of the grain is used in defining a circle. Furthermore, in order to evaluate the deviation in the target, as shown in FIG. 1, four locations of the cross section are measured in a similar manner, and the average value of these four locations is calculated.

Moreover, the present invention may further contain, as accessory components, one or more types of elements selected from Ga, Ti, Au, Pt, Pd, Bi, B, C, Mo, and Si in an amount of 30 at % or less. These components also show the preferred materials and component composition (including the compositional range) for use as a phase change recording material; that is, a medium for recording information by utilizing phase transformation. In this case also, the accessory components may be arbitrarily selected in accordance with the mode of using the thin film made from a phase change recording material.

Moreover, since these elements are also elements that form oxides in the same manner as Ag, In, and Ge, these elements can be included in the Sb—Te-based alloy sintered sputtering target as grains of oxides of one or more types of elements selected from Ga, Ti, Au, Pt, Pd, Bi, B, C, Mo, and Si. In this case also, in order to refine the oxide grains, preferably the average grain size is 0.5 µm or less, the maximum grain size of oxides is 1.5 µm or less, and the number of oxide grains having a size of 1 µm or more is 0.5% or less relative to the total number of oxide grains.

In the target of the present invention, the average content of oxygen is preferably 1500 to 2500 wtppm. While the existence of oxygen improves the thermal stability of sputtering deposition on the one hand, it also generates grains of oxides formed from constituent elements and oxygen in the target. Furthermore, these oxide grains may become the cause of abnormal discharge. Accordingly, the oxygen content is preferably set to be within the foregoing range. Moreover, there may be a concentration difference in the oxygen content in the target depending on the location. In locations where there is much oxygen, the oxygen content may reach 3500 ppm. Since a concentration difference is undesirable in terms of the uniformity of the sputtered film, the oxygen content is desirably 2000 wtppm or less.

When measuring oxygen, four arbitrary locations of the cross section of the target (same locations shown in FIG. 1) are measured, and the average oxygen concentration of the four locations, the maximum oxygen concentration among the four locations, and the maximum difference among the respective oxygen concentrations of the four locations are calculated and identified, respectively, and used as the average content, maximum content and concentration difference of oxygen. Oxygen may be analyzed by using the analyzer manufactured by LECO, which is often used in the fields of analyzing carbon, sulfur, oxygen, nitrogen and hydrogen.

Furthermore, the present invention may further contain oxides of one or more types of elements selected from Mg, Al, Si, Ti, Cu, Y, Zr, Nb, Hf, Ta, Ce, and Cd in an amount of 0.1 to 5 mol %. The existence of oxygen improves the thermal stability of sputtering deposition. Nevertheless, since the excessive existence of oxygen tends to generate abnormal discharge, the amount of oxides is desirably 5 mol % or less. Moreover, if the amount of oxides is less than 0.1 mol %, there is no effect of adding oxides and, therefore, the amount of oxides is set to be within the foregoing range. It is also preferable to finely disperse these oxides, and preferably the average grain size is 0.5 µm or less, the maximum grain size of oxides is 1.5 µm or less, and the number of oxide grains having a size of 1 µm or more is 0.5% or less relative to the total number of oxide grains.

A preferable example of producing the Sb—Te-based alloy is now explained. Foremost, a Sb—Te-based alloy powder obtained by weighing the raw material shots of the respective constituent elements and controlling the grain size to inhibit excessive oxidation (normally the grain size is controlled to be 5 mm or less), and pulverizing the raw material shots using a jet mill or the like is used. Next, these powders are subject to vacuum melting in a vacuumed (normally vacuumed to $8.5 \times 10^{-3}$ Pa or less) melting furnace at 950° C. for 10 minutes. Subsequently, gas atomization is performed using high purity Ar gas with the target level being a grain size of roughly 20 µm.

Jet mill pulverization is performed in order to refine and uniformly disperse the oxides in the powders. Consequently, a raw material powder normally having an average grain size of 2 µm, a maximum crystal grain size of 5 µm, and an oxygen content of 1500 to 2800 wtppm is obtained. The obtained raw material powder is hot pressed. The hot press conditions for preparing a target via sintering are normally a vacuum, rate of temperature increase: 5 to 10° C./minute, end-point temperature: 400 to 600° C., and pressure: 200 to 400 kgf/cm².

Conditions of the foregoing jet mill pulverization and hot press are set, and the Sb—Te-based alloy sintered sputtering target of the present invention is produced according to the conditions of the present invention so that the average grain size of oxides is 0.5 µm or less, the number of oxide grains having a size of 1 µm or more or more is 0.5% or less relative to the total number of oxide grains, and the average grain size is 2 to 5 µm. Furthermore, the Sb—Te-based alloy sintered sputtering target is produced so that the average content of oxygen is 1500 to 2500 wtppm. The foregoing conditions of the target are essential conditions for preferably inhibiting the generation of particles, abnormal discharge (arcing) and nodules, as well as the generation of cracks or fractures of the target during sputtering. As a result of sputtering a target comprising these conditions, it is possible to form a more uniform film in comparison to conventional technologies.

In particular, the cause of generation of particles is largely affected by the size of oxide grains contained in the Sb—Te-based alloy target and the oxygen concentration in the Sb—Te-based alloy target. The foregoing conditions of the target yield an effect of being able to considerably inhibit the generation of arcing and particles. Moreover, by reducing the grain size of the oxides contained in the target, the eroded surface of the target can be kept smooth even after the erosion, and there is an advantage in being able to also inhibit the particles that are generated in conventional technologies as a result of redeposits becoming attached to the irregularities on the eroded surface and then growing into nodules, and consequently collapsing.

Moreover, the Sb—Te-based alloy sintered sputtering target of the present invention may contain, as accessory components, one or more types of elements selected from Ga, Ti, Au, Pt, Pd, Bi, B, C, Mo, and Si. These accessory components are preferably added to the raw material at the stage of gas atomization. Moreover, the present invention may contain oxides of one or more types of elements selected from Mg, Al, Si, Ti, Cu, Y, Zr, Nb, Hf, Ta, Ce, and Cd. These oxides are preferably added to the raw material at the stage after the jet mill pulverization.

Moreover, as a result of increasing the purity of the Sb—Te-based alloy sintered sputtering target, impurities other than the main component and oxygen or additive accessory components will become the source of abnormal discharge (arcing). In the present invention, the main component desirably has a purity of 4N or higher. Consequently, it will be possible to effectively prevent arcing caused by impurities, and inhibit the generation of particles caused by arcing. The purity of the main component is more preferably 5N or higher.

EXAMPLES

The Examples of the present invention are now explained. Note that these Examples are merely exemplifications, and the present invention is not limited to these Examples. In other words, the present invention covers all modes or modifications other than those described in the Examples within the scope of the technical concept of this invention.

Example 1-1

As shown in Table 1, the respective raw material shots of Te, Sb, and Ge having a purity of 99.999% (5N) excluding gas components were weighed to attain Ge: 9.5 at %, Sb: 55.1 at %, and Te: 35.4 at %. The raw materials were selected to have a grain size of 5 mm or less with the intention of preventing oxidation. Next, these powders were subject to high frequency melting in a melting furnace, which was vacuumed to have a vacuum degree of $8.5 \times 10^{-3}$ Pa or less, at 950° C. for 10 minutes. After the melting process, gas atomization was performed using high purity Ar gas with the target level being a grain size of 20 µm.

Jet mill pulverization was performed in order to refine and uniformly disperse the oxides in the powders. Consequently, a raw material powder having an average grain size of 2 µm, a maximum crystal grain size of 5 µm, and an oxygen content of 2000 wtppm was obtained. The obtained raw material powder was sintered via hot pressing (vacuum, rate of temperature increase: 5° C./minute, end-point temperature: 570° C., pressure: 200 kgf/cm²).

As a result of subjecting the thus obtained target to the foregoing evaluation, the average value of the oxygen concentration was 2000 ppm, the maximum concentration was 3000 ppm, and the difference in the oxygen concentration was 1200 ppm. As the oxides, $Sb_2O_3$, $GeO_2$ were recognized. The average grain size of the oxides was 0.2 µm, the maximum grain size was 1.2 µm, and the number of grains having a size of 1 µm or more relative to the total number of grains was 0.4%. Moreover, the number of particles generated during sputtering was 53 particles and fewer than the target level of 100 particles, and favorable results were obtained. The foregoing results are shown in Table 1. Table 1 also shows the main oxides that existed in the target.

Example 1-2

A sintered target was prepared based on the same production conditions as Example 1-1 using the composition shown in Table 1. With the obtained target, the average oxygen concentration was 1600 ppm, the maximum value of the oxygen concentration was 2500 ppm, and the difference in the oxygen concentration was 1300 ppm. As the oxides, $Sb_2O_3$, $GeO_2$ were recognized. Moreover, the average grain size of the oxides was 0.1 µm, the maximum grain size was 1.1 µm, and the number of grains having a size of 1 µm or more relative to the total number of grains was 0.2%. As a result of sputtering the thus obtained target, the number of particles generated was 37 particles and fewer than the number of particles of Example 1-1, and favorable results were obtained. The foregoing results are shown in Table 1. Table 1 also shows the main oxides that existed in the target.

Example 1-3

As shown in Table 1, other than adding In, a sintered target was prepared based on the same production conditions as Example 1-1. As a result of evaluating the thus obtained target, the average value of the oxygen concentration was 1800 ppm, the maximum concentration was 2000 ppm, and the difference in the oxygen concentration was 1500 ppm. As the oxides, $GeO_2$, $TeO_2$ were recognized. The average grain size of the oxides was 0.2 µm, the maximum grain size was 1.3 µm, and the number of grains having a size of 1 µm or more relative to the total number of grains was 0.1%.

Moreover, the number of particles generated during sputtering was 80 particles and fewer than the target level of 100 particles, and favorable results were obtained. The foregoing results are shown in Table 1. Table 1 also shows the main oxides that existed in the target.

Example 1-4

As shown in Table 1, other than adding In in substitute for Ge, a sintered target was prepared based on the same production conditions as Example 1-1. As a result of evaluating the thus obtained target, the average value of the oxygen concentration was 2500 ppm, the maximum concentration was 3500 ppm, and the difference in the oxygen concentration was 2000 ppm. As the oxides, $In_2O_3$, $Sb_2O_3$, $TeO_2$ were recognized. The average grain size of the oxides was 0.1 µm, the maximum grain size was 1.3 µm, and the number of grains having a size of 1 µm or more relative to the total number of grains was 0.4%.

Moreover, the number of particles generated during sputtering was 66 particles and fewer than the target level of 100 particles, and favorable results were obtained. The foregoing results are shown in Table 1. Table 1 also shows the main oxides that existed in the target.

Example 1-5

As shown in Table 1, other than changing the composition ratio to Ge: 70.5, Sb: 10.5, and Te: 19.0, a sintered target was prepared based on the same production conditions as Example 1-1. As a result of evaluating the thus obtained target, the average value of the oxygen concentration was 1600 ppm, the maximum concentration was 3000 ppm, and the difference in the oxygen concentration was 1000 ppm. As the oxides, $GeO_2$ was recognized. The average grain size of the oxides was 0.1 µm, the maximum grain size was 1.1 µm, and the number of grains having a size of 1 µm or more relative to the total number of grains was 0.4%.

Moreover, the number of particles generated during sputtering was 61 particles and fewer than the target level of 100 particles, and favorable results were obtained. The foregoing results are shown in Table 1. Table 1 also shows the main oxides that existed in the target.

Example 1-6

As shown in Table 1, other than adding Ag in substitute for Ge, a sintered target was prepared based on the same production conditions as Example 1-1. As a result of evaluating the thus obtained target, the average value of the oxygen concentration was 2000 ppm, the maximum concentration was 3500 ppm, and the difference in the oxygen concentration was 500 ppm. As the oxides, $Ag_2O$, $Sb_2O_3$, $TeO_2$ were recognized. The average grain size of the oxides was 0.2 µm, the maximum grain size was 1.1 µm, and the number of grains having a size of 1 µm or more relative to the total number of grains was 0.3%.

Moreover, the number of particles generated during sputtering was 75 particles and fewer than the target level of 100 particles, and favorable results were obtained. The foregoing results are shown in Table 1. Table 1 also shows the main oxides that existed in the target.

Example 1-7

As shown in Table 1, other than adding Bi, a sintered target was prepared based on the same production conditions as Example 1-1. As a result of evaluating the thus obtained target, the average value of the oxygen concentration was 2300 ppm, the maximum concentration was 3400 ppm, and the difference in the oxygen concentration was 1700 ppm. As the oxides, $Bi_2O_3$, $GeO_2$, $TeO_2$ were recognized. The average grain size of the oxides was 0.2 µm, the maximum grain size was 1.2 µm, and the number of grains having a size of 1 µm or more relative to the total number of grains was 0.3%.

Moreover, the number of particles generated during sputtering was 79 particles and fewer than the target level of 100 particles, and favorable results were obtained. The foregoing results are shown in Table 1. Table 1 also shows the main oxides that existed in the target.

Example 1-8

As shown in Table 1, other than substituting a part of Ge with Ga, a sintered target was prepared based on the same production conditions as Example 1-1. As a result of evaluating the thus obtained target, the average value of the oxygen concentration was 1900 ppm, the maximum concentration was 2600 ppm, and the difference in the oxygen concentration was 800 ppm. The average grain size of the oxides was 0.2 µm, the maximum grain size was 0.9 µm, and the number of grains having a size of 1 µm or more relative to the total number of grains was 0.2%. Moreover, the number of particles generated during sputtering was 48 particles and fewer than the target level of 100 particles, and favorable results were obtained.

Example 1-9

As shown in Table 1, Sb: 20.0 at %, Te: 55.0 at %, Ge: 15.0 at %, and Si: 10.0 at % were used as the raw materials, and a sintered target was prepared based on the same conditions as Example 1-1. As a result of evaluating the thus obtained target, the average value of the oxygen concentration was 1700 ppm, the maximum concentration was 2000 ppm, and the difference in the oxygen concentration was 900 ppm. As the oxides, $TeO_2$, $SiO_2$ were recognized. The average grain size of the oxides was 0.1 µm, the maximum grain size was 1.0 µm, and the number of grains having a size of 1 µm or more relative to the total number of grains was 0.2%.

Moreover, the number of particles generated during sputtering was 31 particles and fewer than the target level of 100 particles, and favorable results were obtained.

Example 1-10

As shown in Table 1, Sb: 18.9 at %, Te: 47.2 at %, Ge: 18.9 at %, and C: 15.0 at % were used as the raw materials, and a sintered target was prepared based on the same conditions as Example 1-1. As a result of evaluating the thus obtained target, the average value of the oxygen concentration was 2200 ppm, the maximum concentration was 3200 ppm, and the difference in the oxygen concentration was 1000 ppm. As the oxides, $GeO_2$, $TeO_2$ were recognized. The average grain size of the oxides was 0.2 µm, the maximum grain size was 1.1 µm, and the number of grains having a size of 1 µm or more relative to the total number of grains was 0.2%.

Moreover, the number of particles generated during sputtering was 52 particles and fewer than the target level of 100 particles, and favorable results were obtained.

Example 1-11

As shown in Table 1, Sb: 18.9 at %, Te: 47.2 at %, Ge: 18.9 at %, and B: 15.0 at % were used as the raw materials, and a sintered target was prepared based on the same conditions as Example 1-1. As a result of evaluating the thus obtained target, the average value of the oxygen concentration was 2100 ppm, the maximum concentration was 2900 ppm, and, the difference in the oxygen concentration was 900 ppm. As the oxides, $GeO_2$, $TeO_2$ were recognized. The average grain size of the oxides was 0.3 μm, the maximum grain size was 1.4 μm, and the number of grains having a size of 1 μm or more relative to the total number of grains was 0.4%.

Moreover, the number of particles generated during sputtering was 68 particles and fewer than the target level of 100 particles, and favorable results were obtained.

Example 1-12

As shown in Table 1, Sb: 60.0 at %, Te: 22.0 at %, Ge: 10.0 at %, and Ti: 8.0 at % were used as the raw materials, and a sintered target was prepared based on the same conditions as Example 1-1. As a result of evaluating the thus obtained target, the average value of the oxygen concentration was 2400 ppm, the maximum concentration was 3600 ppm, and the difference in the oxygen concentration was 1500 ppm. As the oxides, $Sb_2O_3$, $TiO_2$ were recognized. The average grain size of the oxides was 0.3 μm, the maximum grain size was 1.5 μm, and the number of grains having a size of 1 μm or more relative to the total number of grains was 0.3%.

Moreover, the number of particles generated during sputtering was 54 particles and fewer than the target level of 100 particles, and favorable results were obtained.

Example 1-13

As shown in Table 1, Sb: 60.0 at %, Te: 22.0 at %, Ge: 10.0 at %, and Mo: 8.0 at % were used as the raw materials, and a sintered target was prepared based on the same conditions as Example 1-1. As a result of evaluating the thus obtained target, the average value of the oxygen concentration was 1800 ppm, the maximum concentration was 2700 ppm, and the difference in the oxygen concentration was 1200 ppm. As the oxides, $Sb_2O_3$, $MoO_2$ were recognized. The average grain size of the oxides was 0.2 μm, the maximum grain size was 1.0 μm, and the number of grains having a size of 1 μm or more relative to the total number of grains was 0.2%.

Moreover, the number of particles generated during sputtering was 65 particles and fewer than the target level of 100 particles, and favorable results were obtained.

Comparative Example 1-1

Other than increasing the oxygen content in the target by leaving the raw material powder in the atmosphere for 6 hours or longer, a sintered target was prepared based on the same production conditions as Example 1-1. As a result of evaluating the thus obtained target, as shown in Table 1, the average value of the oxygen concentration was 5000 ppm, the maximum concentration was 10000 ppm, and the difference in the oxygen concentration was 1800 ppm. As the oxides, $Sb_2O_3$, $GeO_2$ were recognized.

The average grain size of the oxides was 0.5 μm, the maximum grain size was 2.1 μm, and the number of grains having a size of 1 μm or more relative to the total number of grains was 0.6%. Moreover, the number of particles generated during sputtering was 434 particles and considerably greater than the target level of 100 particles. The foregoing results are shown in Table 1. Table 1 also shows the main oxides that existed in the target.

Comparative Example 1-2

Other than lowering the oxygen content in the target by subjecting the raw material powder to hydrogen reduction treatment, a sintered target was prepared based on the same production conditions as Example 1-2. As a result of evaluating the thus obtained target, as shown in Table 1, the average value of the oxygen concentration was 500 ppm, the maximum concentration was 1000 ppm, and the difference in the oxygen concentration was 800 ppm. As the oxides, $Sb_2O_3$, $GeO_2$ were recognized.

The average grain size of the oxides was 0.6 μm, the maximum grain size was 2.4 μm, and the number of grains having a size of 1 μm or more relative to the total number of grains was 0.65%. Moreover, the number of particles generated during sputtering was 408 particles and considerably greater than the target level of 100 particles. The foregoing results are shown in Table 1. Table 1 also shows the main oxides that existed in the target.

Comparative Example 1-3

Other than leaving the raw material powder in the atmosphere for 6 hours or longer and mixing a powder produced based on a standard process, the same production conditions as Example 1-3 were used, and the oxygen content in the target, the maximum oxygen concentration, and the difference in the oxygen concentration all increased. As a result of evaluating the thus obtained target, as shown in Table 1, the average value of the oxygen concentration was 4000 ppm, the maximum concentration was 6000 ppm, and the difference in the oxygen concentration was 3500 ppm. As the oxides, $GeO_2$, $TeO_2$ were recognized.

The average grain size of the oxides was 0.6 μm, the maximum grain size was 2.8 μm, and the number of grains having a size of 1 μm or more relative to the total number of grains was 0.2%. Moreover, the number of particles generated during sputtering was 458 particles and considerably greater than the target level of 100 particles. The foregoing results are shown in Table 1. Table 1 also shows the main oxides that existed in the target.

Comparative Example 1-4

Other than mixing a powder produced based on a standard process and a powder that was subject to hydrogen reduction treatment, the same production conditions as Example 1-4 were used, and the oxygen content in the target, the maximum oxygen concentration, and the difference in the oxygen concentration all increased. As a result of evaluating the thus obtained target, as shown in Table 1, the average value of the oxygen concentration was 3000 ppm, the maximum concentration was 4000 ppm, and the difference in the oxygen concentration was 4000 ppm. As the oxides, $In_2O_3$, $Sb_2O_3$, $TeO_2$ were recognized.

The average grain size of the oxides was 0.1 μm, the maximum grain size was 1.1 μm, and the number of grains having a size of 1 μm or more relative to the total number of grains was 0.5%. Moreover, the number of particles generated during sputtering was 416 particles and considerably greater than the target level of 100 particles. The foregoing results are shown in Table 1. Table 1 also shows the main oxides that existed in the target.

Comparative Example 1-5

Other than leaving the raw material powder in the atmosphere for 6 hours or longer, the same production conditions as Example 1-5 were used, and the oxygen content in the target, the maximum oxygen concentration, and the difference in the oxygen concentration all increased. As a result of evaluating the thus obtained target, as shown in Table 1, the average value of the oxygen concentration was 3500 ppm, the maximum concentration was 5000 ppm, and the difference in the oxygen concentration was 1800 ppm. As the oxides, $GeO_2$ was recognized.

The average grain size of the oxides was 0.2 μm, the maximum grain size was 1.8 μm, and the number of grains having a size of 1 μm or more relative to the total number of grains was 0.4%. Moreover, the number of particles generated during sputtering was 314 particles and considerably greater than the target level of 100 particles. The foregoing results are shown in Table 1. Table 1 also shows the main oxides that existed in the target.

Comparative Example 1-6

Other than leaving the raw material powder in the atmosphere for 6 hours or longer and mixing a powder produced based on a standard process, the same production conditions as Example 1-6 were used, and the oxygen content in the target, the maximum oxygen concentration, and the difference in the oxygen concentration all increased. As a result of evaluating the thus obtained target, as shown in Table 1, the average value of the oxygen concentration was 10000 ppm, the maximum concentration was 15000 ppm, and the difference in the oxygen concentration was 8000 ppm. As the oxides, $Ag_2O$, $Sb_2O_3$, $TeO_2$ were recognized.

The average grain size of the oxides was 0.2 μm, the maximum grain size was 2.4 μm, and the number of grains having a size of 1 μm or more relative to the total number of grains was 0.3%. Moreover, the number of particles generated during sputtering was 354 particles and considerably greater than the target level of 100 particles. The foregoing results are shown in Table 1. Table 1 also shows the main oxides that existed in the target.

Comparative Example 1-7

Other than leaving the raw material powder in the atmosphere for 6 hours or longer and mixing a powder produced based on a standard process, the same production conditions as Example 1-7 were used, and the oxygen content in the target, the maximum oxygen concentration, and the difference in the oxygen concentration all increased. As a result of evaluating the thus obtained target, as shown in Table 1, the average value of the oxygen concentration was 6300 ppm, the maximum concentration was 9400 ppm, and the difference in the oxygen concentration was 4000 ppm. As the oxides, $Bi_2O_3$, $Ge_2O_2$, $TeO_2$ were recognized.

The average grain size of the oxides was 0.6 μm, the maximum grain size was 2.5 μm, and the number of grains having a size of 1 μm or more relative to the total number of grains was 0.6%. Moreover, the number of particles generated during sputtering was 398 particles and considerably greater than the target level of 100 particles. The foregoing results are shown in Table 1. Table 1 also shows the main oxides that existed in the target.

As evident upon comparing the foregoing Examples and Comparative Examples, it can be understood that the generation of particles can be inhibited by attaining a uniform oxygen concentration and refining the oxide grains. It is thereby possible to achieve stable sputtering and yield the effect of improving the uniformity of the sputtered film.

TABLE 1

| | Composition | | | | Evaluation of oxygen concentration | | |
|---|---|---|---|---|---|---|---|
| | Composition | Sb/at % | Te/at % | Other/at % | Average oxygen concentration/ ppm | Maximum oxygen concentration/ ppm | Difference in oxygen concentration |
| Example 1-1 | Ge—Sb—Te | 55.1 | 35.4 | Ge(9.5) | 2000 | 3000 | 1200 |
| Example 1-2 | Ge—Sb—Te | 55.1 | 35.4 | Ge(9.5) | 1600 | 2500 | 1300 |
| Example 1-3 | Ge—In—Sb—Te | 16.1 | 53.8 | Ge(16.0), In(9.1) | 1800 | 2000 | 1500 |
| Example 1-4 | In—Sb—Te | 33.5 | 50.3 | In(11.2) | 2500 | 3500 | 2000 |
| Example 1-5 | Ge—Sb—Te | 10.5 | 19.0 | Ge(70.5) | 1600 | 3000 | 1000 |
| Example 1-6 | Ag—Sb—Te | 21.1 | 52.8 | Ag(21.1) | 2000 | 3500 | 500 |
| Example 1-7 | Bi—Ge—Sb—Te | 10.0 | 50.0 | Bi(9.0), Ge(31) | 2300 | 3400 | 1700 |
| Example 1-8 | Ge—Ga—Sb—Te | 55.1 | 35.4 | Ge(6.5), Ga(3.0) | 1900 | 2600 | 800 |
| Example 1-9 | Si—Ge—Sb—Te | 20.0 | 55.0 | Ge(15.0), Si(10.0) | 1700 | 2000 | 900 |
| Example 1-10 | C—Ge—Sb—Te | 18.9 | 47.2 | Ge(18.9), C(15.0) | 2200 | 3200 | 1000 |
| Example 1-11 | B—Ge—Sb—Te | 18.9 | 47.2 | Ge(18.9), B(15.0) | 2100 | 2900 | 900 |
| Example 1-12 | Ti—Ge—Sb—Te | 60.0 | 22.0 | Ge(10.0), Ti(8.0) | 2400 | 3600 | 1500 |
| Example 1-13 | Ge—Mo—Sb—Te | 60.0 | 22.0 | Ge(10.0), Mo(8.0) | 1800 | 2700 | 1200 |
| Comparative Example 1-1 | Ge—Sb—Te | 54.8 | 35.7 | Ge(9.5) | 5000 | 10000 | 1800 |
| Comparative Example 1-2 | Ge—Sb—Te | 54.8 | 35.7 | Ge(9.5) | 500 | 1000 | 800 |
| Comparative Example 1-3 | Ge—In—Sb—Te | 16.0 | 53.5 | Ge(15.9), In(9.1) | 4000 | 6000 | 3500 |
| Comparative Example 1-4 | In—Sb—Te | 33.5 | 50.3 | In(11.2) | 3000 | 4000 | 4000 |
| Comparative Example 1-5 | Ge—Sb—Te | 10.5 | 19.0 | Ge(70.5) | 3500 | 5000 | 1800 |
| Comparative Example 1-6 | Ag—Sb—Te | 21.1 | 52.8 | Ag(21.1) | 10000 | 15000 | 8000 |
| Comparative Example 1-7 | Bi—Ge—Sb—Te | 10.0 | 50.0 | Bi(9.0), Ge(31) | 6300 | 9400 | 4000 |

TABLE 1-continued

| | | Evaluation of texture | | | |
|---|---|---|---|---|---|
| | Oxides | Grain size of oxides (μm) | Maximum grain size of oxides (μm) | Number of grains of 1 μm or larger/Total number of grains | Effect Number of particles |
| Example 1-1 | Sb2O3, GeO2 | 0.2 | 1.2 | 0.4 | 53 |
| Example 1-2 | Sb2O3, GeO2 | 0.1 | 1.1 | 0.2 | 37 |
| Example 1-3 | GeO2, TeO2 | 0.2 | 1.3 | 0.1 | 80 |
| Example 1-4 | In2O3, Sb2O3, TeO2 | 0.1 | 1.3 | 0.4 | 66 |
| Example 1-5 | GeO2 | 0.1 | 1.1 | 0.4 | 61 |
| Example 1-6 | Ag2O, Sb2O3, TeO2 | 0.2 | 1.1 | 0.3 | 75 |
| Example 1-7 | Bi2O3, GeO2, TeO2 | 0.2 | 1.2 | 0.3 | 79 |
| Example 1-8 | Sb2O3, GeO2 | 0.2 | 0.9 | 0.2 | 48 |
| Example 1-9 | TeO2, SiO2 | 0.1 | 1.0 | 0.2 | 31 |
| Example 1-10 | GeO2, TeO2 | 0.2 | 1.1 | 0.2 | 52 |
| Example 1-11 | GeO2, TeO2 | 0.3 | 1.4 | 0.4 | 68 |
| Example 1-12 | Sb2O3, TiO2 | 0.3 | 1.5 | 0.3 | 54 |
| Example 1-13 | Sb2O3, MoO2 | 0.2 | 1.0 | 0.2 | 65 |
| Comparative Example 1-1 | Sb2O3, GeO2 | 0.5 | 2.1 | 0.6 | 434 |
| Comparative Example 1-2 | Sb2O3, GeO2 | 0.6 | 2.4 | 0.65 | 408 |
| Comparative Example 1-3 | GeO2, TeO2 | 0.6 | 2.8 | 0.2 | 458 |
| Comparative Example 1-4 | In2O3, Sb2O3, TeO2 | 0.1 | 1.1 | 0.5 | 416 |
| Comparative Example 1-5 | GeO2 | 0.2 | 1.8 | 0.4 | 314 |
| Comparative Example 1-6 | Ag2O, Sb2O3, TeO2 | 0.2 | 2.4 | 0.3 | 354 |
| Comparative Example 1-7 | Bi2O3, GeO2, TeO2 | 0.6 | 2.5 | 0.6 | 398 |

Example 2-1

The respective raw material shots of Te, Sb, and Ge having a purity of 99.999% (5N) excluding gas components were weighed to attain Ge: 9.5, Sb: 55.1, and Te: 35.4. The raw materials were selected to have a grain size of 5 mm or less with the intention of preventing oxidation. Next, these powders were subject to high frequency melting in a melting furnace, which was vacuumed to have a vacuum degree of $8.5 \times 10^{-3}$ Pa or less, at 950° C. for 10 minutes. After the melting process, gas atomization was performed using high purity Ar gas with the target level being a grain size of 20 μm.

Jet mill pulverization was performed in order to refine and uniformly disperse the oxides in the powders. Consequently, a raw material powder having an average grain size of 2 μm, a maximum crystal grain size of 5 μm, and an oxygen content of 2000 wtppm was obtained. After adding 5 mol % of $SiO_2$ to the obtained raw material powder, the raw material powder was sintered via hot pressing (vacuum, rate of temperature increase 5° C./minute, end-point temperature: 570° C., pressure 200 kgf/cm$^2$).

As a result of subjecting the thus obtained target to the foregoing evaluation, the average grain size of the oxides was 0.1 μm, the maximum grain size was 1.3 μm, and the number of grains having a size of 1 μm or more relative to the total number of grains was 0.4%. Moreover, the number of particles generated during sputtering was 42 particles and fewer than the target level of 100 particles, and favorable results were obtained.

Example 2-2

Other than not adding $SiO_2$, a sintered target was prepared based on the same production conditions as Example 2-1. As a result of observing the cross section of the thus obtained target, the average grain size of the oxides was 0.1 μm, the maximum grain size was 1.0 μm, and the number of grains having a size of 1 μm or more relative to the total number of grains was 0.2%. Moreover, the number of particles generated during sputtering was 59 particles and fewer than the target level of 100 particles, and favorable results were obtained.

Example 2-3

Other than adding In, changing the composition ratio to Ge: 16.0, In: 9.1, Sb: 16.1, and Te: 53.8, and adding 3 mol % of $SiO_2$, a sintered target was prepared based on the same production conditions as Example 2-1. As a result of observing the cross section of the thus obtained target, the average grain size of the oxides was 0.5 μm, the maximum grain size was 0.8 μm, and the number of grains having a size of 1 μm or more relative to the total number of grains was 0.1%. Moreover, the number of particles generated during sputtering was 75 particles and fewer than the target level of 100 particles, and favorable results were obtained.

Example 2-4

Other than adding In in substitute for Ge, changing the composition ratio to In: 11.2, Sb: 33.5, and Te: 50.3, and adding 4 mol % of $SiO_2$, a sintered target was prepared based on the same production conditions as Example 2-1. As a result of observing the cross section of the thus obtained target, the average grain size of the oxides was 0.3 μm, the maximum grain size was 1.1 μm, and the number of grains having a size of 1 μm or more relative to the total number of grains was 0.3%. Moreover, the number of particles generated during sputtering was 60 particles and fewer than the target level of 100 particles, and favorable results were obtained.

Example 2-5

Other than changing the composition ratio to Ge: 70.5, Sb: 10.5, and Te: 19.0 and adding 2 mol % of $TiO_2$, a sintered target was prepared based on the same production conditions as Example 2-1. As a result of observing the cross section of the thus obtained target, the average grain size of the oxides was 0.45 μm, the maximum grain size was 0.5 μm, and the number of grains having a size of 1 μm or more relative to the total number of grains was 0.4%. Moreover, the number of particles generated during sputtering was 83 particles and fewer than the target level of 100 particles, and favorable results were obtained.

Example 2-6

Other than changing the composition ratio to Ag: 21.1, Sb: 21.1, and Te: 52.8 and adding 1 mol % of $MgO_2$, a sintered target was prepared based on the same production conditions as Example 2-1. As a result of observing the cross section of the thus obtained target, the average grain size of the oxides was 0.1 μm, the maximum grain size was 0.7 μm, and the number of grains having a size of 1 μm or more relative to the total number of grains was 0.5%. Moreover, the number of particles generated during sputtering was 61 particles and fewer than the target level of 100 particles, and favorable results were obtained.

Example 2-7

Other than adding $Al_2O_3$ in substitute for $SiO_2$, a sintered target was prepared based on the same production conditions as Example 2-1. As a result of observing the cross section of the thus obtained target, the average grain size of the oxides was 0.1 μm, the maximum grain size was 0.6 μm, and the number of grains having a size of 1 μm or more relative to the total number of grains was 0.3%. Moreover, the number of particles generated during sputtering was 64 particles and fewer than the target level of 100 particles, and favorable results were obtained.

Example 2-8

Other than adding $ZrO_2$ in substitute for $SiO_2$, a sintered target was prepared based on the same production conditions as Example 2-1. As a result of observing the cross section of the thus obtained target, the average grain size of the oxides was 0.3 μm, the maximum grain size was 0.9 μm, and the number of grains having a size of 1 μm or more relative to the total number of grains was 0.4%. Moreover, the number of particles generated during sputtering was 73 particles and fewer than the target level of 100 particles, and favorable results were obtained.

Example 2-9

Other than adding $Nb_2O_5$ in substitute for $SiO_2$, a sintered target was prepared based on the same production conditions as Example 2-1. As a result of observing the cross section of the thus obtained target, the average grain size of the oxides was 0.2 μm, the maximum grain size was 1.1 μm, and the number of grains having a size of 1 μm or more relative to the total number of grains was 0.5%. Moreover, the number of particles generated during sputtering was 79 particles and fewer than the target level of 100 particles, and favorable results were obtained.

Example 2-10

Other than adding $HfO_2$ in substitute for $SiO_2$, a sintered target was prepared based on the same production conditions as Example 2-1. As a result of observing the cross section of the thus obtained target, the average grain size of the oxides was 0.2 μm, the maximum grain size was 0.8 μm, and the number of grains having a size of 1 μm or more relative to the total number of grains was 0.3%. Moreover, the number of particles generated during sputtering was 62 particles and fewer than the target level of 100 particles, and favorable results were obtained.

Example 2-11

Other than adding $Ta_2O_5$ in substitute for $SiO_2$, a sintered target was prepared based on the same production conditions as Example 2-1. As a result of observing the cross section of the thus obtained target, the average grain size of the oxides was 0.3 μm, the maximum grain size was 1.0 μm, and the number of grains having a size of 1 μm or more relative to the total number of grains was 0.4%. Moreover, the number of particles generated during sputtering was 62 particles and fewer than the target level of 100 particles, and favorable results were obtained.

Example 2-12

Other than adding $Nb_2O_5$ and $Ta_2O_5$ at a ratio of 1:1 in substitute for $SiO_2$, a sintered target was prepared based on the same production conditions as Example 2-1. As a result of observing the cross section of the thus obtained target, the average grain size of the oxides was 0.3 μm, the maximum grain size was 1.0 μm, and the number of grains having a size of 1 μm or more relative to the total number of grains was 0.4%. Moreover, the number of particles generated during sputtering was 75 particles and fewer than the target level of 100 particles, and favorable results were obtained.

Comparative Example 2-1

Other than increasing the additive amount of $SiO_2$ to 6 mol % and additionally increasing the grain size of the oxides, a sintered target was prepared based on the same production conditions as Example 2-1. As a result of observing the cross section of the thus obtained target, the average grain size of the oxides was 0.7 μm, the maximum grain size was 1.8 μm, and the number of grains having a size of 1 μm or more relative to the total number of grains was 0.6%. Moreover, the number of particles generated during sputtering was 382 particles and considerably greater than the target level of 100 particles.

Comparative Example 2-2

Other than not adding $SiO_2$, a sintered target was prepared based on the same production conditions as Comparative Example 2-1. As a result of observing the cross section of the thus obtained target, the average grain size of the oxides was 0.8 μm, the maximum grain size was 1.9 μm, and the number of grains having a size of 1 μm or more relative to the total number of grains was 0.65%. Moreover, the number of particles generated during sputtering was 429 particles and considerably greater than the target level of 100 particles.

Comparative Example 2-3

Other than reducing the additive amount of $SiO_2$ to 0.08 mol %, a sintered target was prepared based on the same production conditions as Example 2-3. As a result of observing the cross section of the thus obtained target, the average grain size of the oxides was 0.05 µm, the maximum grain size was 1.1 µm, and the number of grains having a size of 1 µm or more relative to the total number of grains was 0.2%. Moreover, the number of particles generated during sputtering was 74 particles and, while this was lower than the target level of 100 particles or less, the thermal stability of the film could not be obtained.

Example 2-13

Other than selecting the grain size of the raw material powder in order to coarsen the grain size of the oxides, a sintered target was prepared based on the same production conditions as Example 2-4. As a result of observing the cross section of the thus obtained target, the average grain size of the oxides was 1.0 µm, the maximum grain size was 2.5 µm, and the number of grains having a size of 1 µm or more relative to the total number of grains was 0.7%. The number of particles generated during sputtering was 124 particles, and the number of particles decreased considerably in comparison to foregoing Comparative Examples 2-1 to 2-3. Nevertheless, in comparison to Examples 2-1 to 2-12, since the number of particles generated during sputtering increased slightly from the target level of 100 particles, it can be understood that it is necessary to control the grain size of the oxides to be added depending on the purpose and use.

Example 2-14

Other than coarsening the grain size of TiO₂ as the additive element by selecting the grain size of the raw material powder, a sintered target was prepared based on the same production conditions as Example 2-5. As a result of observing the cross section of the thus obtained target, the average grain size of the oxides was 0.6 µm, the maximum grain size was 2.1 µm, and the number of grains having a size of 1 µm or more relative to the total number of grains was 0.4%. The number of particles generated during sputtering was 148 particles, and the number of particles decreased considerably in comparison to foregoing Comparative Examples 2-1 to 2-3. Nevertheless, in comparison to Examples 2-1 to 2-12, since the number of particles generated during sputtering increased slightly from the target level of 100 particles, as with Example 2-13, it can be understood that it is necessary to control the grain size of the oxides to be added depending on the purpose and use.

Example 2-15

Other than increasing the hot press temperature by 30° C., a sintered target was prepared based on the same production conditions as Example 2-6. As a result of observing the cross section of the thus obtained target, the average grain size of the oxides was 0.9 µm, the maximum grain size was 1.1 µm, and the number of grains having a size of 1 µm or more relative to the total number of grains was 0.65%. The number of particles generated during sputtering was 116 particles, and the number of particles decreased considerably in comparison to foregoing Comparative Examples 2-1 to 2-3. Nevertheless, in comparison to Examples 2-1 to 2-12, since the number of particles generated during sputtering increased slightly from the target level of 100 particles, as with Example 2-13, it can be understood that it is necessary to control the grain size of the oxides to be added depending on the purpose and use.

The foregoing results are shown in Table 2. As evident upon comparing the foregoing Examples and Comparative Examples, it can be understood that the inclusion of a moderate amount of oxides of one or more types of elements selected from Mg, Al, Si, Ti, Cu, Y, Zr, Nb, Hf, Ta, Ce, and Cd in the Sb—Te-based alloy sintered target is effective in inhibiting the generation of particles during sputtering and improving the uniformity of the sputtered film. Moreover, the foregoing effects can be further improved by additionally controlling the grain size of the oxides.

TABLE 2

| | Composition | | | | | |
|---|---|---|---|---|---|---|
| | Composition | Sb/at % | Te/at % | Other/at % | Added oxide | Additive amount of oxide/mol % |
| Example 2-1 | Ge—Sb—Te | 55.1 | 35.4 | Ge(9.5) | SiO2 | 5 |
| Example 2-2 | Ge—Sb—Te | 55.1 | 35.4 | Ge(9.5) | — | — |
| Example 2-3 | Ge—In—Sb—Te | 16.1 | 53.8 | Ge(16.0), In(9.1) | SiO2 | 3 |
| Example 2-4 | In—Sb—Te | 33.5 | 50.3 | In(11.2) | SiO2 | 4 |
| Example 2-5 | Ge—Sb—Te | 10.5 | 19.0 | Ge(70.5) | TiO2 | 2 |
| Example 2-6 | Ag—Sb—Te | 21.1 | 52.8 | Ag(21.1) | MgO2 | 1 |
| Example 2-7 | Ge—Sb—Te | 55.1 | 35.4 | Ge(9.5) | Al2O3 | 5 |
| Example 2-8 | Ge—Sb—Te | 55.1 | 35.4 | Ge(9.5) | ZrO2 | 5 |
| Example 2-9 | Ge—Sb—Te | 55.1 | 35.4 | Ge(9.5) | Nb2O5 | 5 |
| Example 2-10 | Ge—Sb—Te | 55.1 | 35.4 | Ge(9.5) | HfO2 | 5 |
| Example 2-11 | Ge—Sb—Te | 55.1 | 35.4 | Ge(9.5) | Ta2O5 | 5 |
| Example 2-12 | Ge—Sb—Te | 55.1 | 35.4 | Ge(9.5) | Nb2O5 + Ta2O5 | 5(2.5/2.5) |
| Comparative Example 2-1 | Ge—Sb—Te | 54.8 | 35.7 | Ge(9.5) | SiO2 | 6 |
| Comparative Example 2-2 | Ge—Sb—Te | 54.8 | 35.7 | Ge(9.5) | — | — |
| Comparative Example 2-3 | Ge—In—Sb—Te | 16.1 | 53.8 | Ge(15.9), In(9.1) | SiO2 | 0.1 |
| Example 2-13 | In—Sb—Te | 33.5 | 50.3 | In(11.2) | SiO2 | 4 |
| Example 2-14 | Ge—Sb—Te | 10.5 | 19.0 | Ge(70.5) | TiO2 | 4 |
| Example 2-15 | Ag—Sb—Te | 21.1 | 52.8 | Ag(21.1) | MgO2 | 2 |

TABLE 2-continued

| | | Evaluation of texture | | Effect |
|---|---|---|---|---|
| | Grain size of oxides (μm) | Maximum grain size of oxides (μm) | Number of grains of 1 μm or larger/Total number of grains | Number of particles |
| Example 2-1 | 0.1 | 1.3 | 0.4 | 42 |
| Example 2-2 | 0.1 | 1.0 | 0.2 | 59 |
| Example 2-3 | 0.5 | 0.8 | 0.1 | 75 |
| Example 2-4 | 0.3 | 1.1 | 0.3 | 60 |
| Example 2-5 | 0.45 | 0.5 | 0.4 | 83 |
| Example 2-6 | 0.1 | 0.7 | 0.5 | 61 |
| Example 2-7 | 0.1 | 0.6 | 0.3 | 64 |
| Example 2-8 | 0.3 | 0.9 | 0.4 | 73 |
| Example 2-9 | 0.2 | 1.1 | 0.5 | 79 |
| Example 2-10 | 0.2 | 0.8 | 0.3 | 62 |
| Example 2-11 | 0.3 | 1.0 | 0.4 | 62 |
| Example 2-12 | 0.3 | 1.0 | 0.4 | 75 |
| Comparative Example 2-1 | 0.7 | 1.8 | 0.6 | 382 |
| Comparative Example 2-2 | 0.8 | 1.9 | 0.65 | 429 |
| Comparative Example 2-3 | 0.05 | 1.1 | 0.2 | 74 (no high tempature stability of film) |
| Example 2-13 | 1.0 | 2.5 | 0.7 | 124 |
| Example 2-14 | 0.6 | 2.1 | 0.4 | 148 |
| Example 2-15 | 0.9 | 1.1 | 0.65 | 116 |

With the Sb—Te-based alloy sintered target of the present invention, the characteristics of the Sb—Te-based alloy can be improved by controlling the oxide grains configuring the target and controlling the oxygen content. In other words, by refining the oxide grains and attaining a uniform oxygen concentration, it is possible to improve the characteristics of the target and achieve stable sputtering. It is thereby possible to prevent the generation of abnormal discharge originating from the oxides, and inhibit the generation of particles caused by arcing. The present invention additionally yields a superior effect of being able to improve the uniformity of the sputtered film. The present invention is extremely effective as a phase change recording material; that is, a medium for recording information by utilizing phase transformation.

The invention claimed is:

1. A Sb—Te-based alloy sintered sputtering target, wherein:
the target has a composition consisting of Sb in a content of 10 to 60 at %, Te in a content of 20 to 60 at %, oxygen in an average content in the target of 1500 to 2500 wtppm, one or more elements selected from the group consisting of Ag, In, and Ge, one or more oxides of Mg, Al, Si, Ti, Zr, Nb, Hf, and Ta in an amount of 2 to 5 mol %, and unavoidable impurities;
the target comprises oxide grains;
an average size of the oxide grains is 0.5 μm or less;
a number of the oxide grains having a size of 1 μm or more is 0.5% or less relative to a total number of the oxide grains; and
a maximum size of the oxide grains is 1.5 μm or less.

2. A Sb—Te-based alloy sintered sputtering target, wherein:
the target has a composition consisting of Sb in a content of 10 to 60 at %, Te in a content of 20 to 60 at %, one or more elements selected from the group consisting of Ag, In, and Ge, one or more elements selected from the group consisting of Ga, Ti, Au, Pt, Pd, Bi, B, C, Mo, and Si in an amount of 30 at % or less, oxygen in an average content in the target of 1500 to 2500 wtppm, and unavoidable impurities;
the target comprises oxide grains;
an average size of the oxide grains is 0.5 μm or less;
a number of the oxide grains having a size of 1 μm or more is 0.5% or less relative to a total number of the oxide grains; and
a maximum size of the oxide grains is 1.5 μm or less.

3. The Sb—Te-based alloy sintered sputtering target according to claim 2, wherein a maximum content of oxygen in the target is 3500 ppm or less.

4. The Sb—Te-based alloy sintered sputtering target according to claim 2, wherein a concentration difference of oxygen in the target is 2000 wtppm or less.

* * * * *